(12) United States Patent
Cheng et al.

(10) Patent No.: US 11,031,393 B2
(45) Date of Patent: *Jun. 8, 2021

(54) III-V FINS BY ASPECT RATIO TRAPPING AND SELF-ALIGNED ETCH TO REMOVE ROUGH EPITAXY SURFACE

(71) Applicant: INTERNATIONAL BUSINESS MACHINES CORPORATION, Armonk, NY (US)

(72) Inventors: Kangguo Cheng, Schenectady, NY (US); Jeehwan Kim, Cambridge, MA (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/782,314

(22) Filed: Feb. 5, 2020

(65) Prior Publication Data
US 2020/0176445 A1 Jun. 4, 2020

Related U.S. Application Data

(63) Continuation of application No. 15/017,980, filed on Feb. 8, 2016, now Pat. No. 10,615,161.

(51) Int. Cl.
*H01L 27/088* (2006.01)
*H01L 29/66* (2006.01)
(Continued)

(52) U.S. Cl.
CPC .... *H01L 27/0886* (2013.01); *H01L 21/02381* (2013.01); *H01L 21/02461* (2013.01); *H01L 21/02546* (2013.01); *H01L 21/3083* (2013.01); *H01L 21/30612* (2013.01); *H01L 21/823431* (2013.01); *H01L 29/1054* (2013.01); *H01L 29/201* (2013.01); *H01L 29/66795* (2013.01);
(Continued)

(58) Field of Classification Search
CPC ..... H01L 29/7851; H01L 29/785–7856; H01L 29/66795; H01L 21/823431
See application file for complete search history.

(56) References Cited

U.S. PATENT DOCUMENTS

| 7,977,706 B2 | 7/2011 | Lochtefeld |
| 8,274,097 B2 * | 9/2012 | Cheng .................. H01L 29/267 257/190 |

(Continued)

OTHER PUBLICATIONS

Dai, X. et al., "Novel Heterogeneous Integration Technology of III-V Layers and InGaAs FinFETs to Silicon" Advanced Functional Materials (2014) pp. 1-7.
(Continued)

*Primary Examiner* — Tuan A Hoang
(74) *Attorney, Agent, or Firm* — Tutunjian & Bitetto, P.C.; Anthony Curro

(57) ABSTRACT

A semiconductor device that includes a fin structure of a type III-V semiconductor material that is substantially free of defects, and has sidewalls that are substantially free of roughness caused by epitaxially growing the type III-V semiconductor material abutting a dielectric material. The semiconductor device further includes a gate structure present on a channel portion of the fin structure; and a source region and a drain region present on opposing sides of the gate structure.

20 Claims, 10 Drawing Sheets

(51) Int. Cl.
*H01L 21/308* (2006.01)
*H01L 21/306* (2006.01)
*H01L 21/02* (2006.01)
*H01L 29/78* (2006.01)
*H01L 29/10* (2006.01)
*H01L 21/8234* (2006.01)
*H01L 29/201* (2006.01)

(52) U.S. Cl.
CPC ...... *H01L 29/785* (2013.01); *H01L 29/66545* (2013.01)

(56) References Cited

U.S. PATENT DOCUMENTS

| | | | |
|---|---|---|---|
| 8,329,541 | B2 | 12/2012 | Ye et al. |
| 8,513,066 | B2 | 8/2013 | Mathew et al. |
| 8,624,326 | B2 | 1/2014 | Chen et al. |
| 8,836,016 | B2 | 9/2014 | Wu et al. |
| 8,937,299 | B2 | 1/2015 | Basu et al. |
| 9,165,837 | B1* | 10/2015 | Fronheiser ...... H01L 21/823821 |
| 10,615,161 | B2* | 4/2020 | Cheng ............... H01L 21/02546 |
| 2009/0302000 | A1* | 12/2009 | Ito ....................... H01L 21/0273 216/37 |
| 2014/0206197 | A1* | 7/2014 | Nakagawa ........ H01J 37/32458 438/712 |
| 2014/0213037 | A1 | 7/2014 | LiCausi et al. |
| 2014/0217467 | A1* | 8/2014 | Pawlak ............... H01L 27/1207 257/183 |
| 2015/0123166 | A1 | 5/2015 | Jacob et al. |
| 2015/0249087 | A1* | 9/2015 | Cantoro ................. H01L 29/20 257/369 |
| 2015/0255548 | A1* | 9/2015 | Holland ............. H01L 29/1054 438/429 |

OTHER PUBLICATIONS

Park, J.S. et al., "Defect reduction of selective Ge epitaxy in trenches on Si(001) substrates using aspect ratio trapping" Applied Physics Letters (2007) pp. 052113-1-052113-3, vol. 90.

U.S. Office Action issued in U.S. Appl. No. 15/200,777, dated Dec. 1, 2017, pp. 1-24.

U.S. Final Office Action issued in U.S. Appl. No. 15/200,777, dated Apr. 25, 2018, pp. 1-19.

List of IBM Patents or Patent Applications Treated as Related dated Feb. 5, 2020, 2 pages.

* cited by examiner

III-V FINS BY ASPECT RATIO TRAPPING AND SELF-ALIGNED ETCH TO REMOVE ROUGH EPITAXY SURFACE

BACKGROUND

Technical Field

The present disclosure relates to semiconductor devices, and more particularly to semiconductor devices including fin structures composed of III-V semiconductor materials.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one aspect, the present disclosure provides a method of forming a fin structure. In one embodiment, the method includes forming a first semiconductor material in a trench, wherein an aspect ratio of the trench traps defects from reaching an upper surface of the first semiconductor material, and forming a second semiconductor material on the upper surface of first semiconductor material. A portion of the second semiconductor material contacting sidewalls of the trench has a greater roughness than a remaining portion of the second semiconductor material. A two component spacer is formed on the sidewalls of the trench. A first spacer component of the two component spacer is abutting the sidewalls of the trench and is atop the second semiconductor material having the greater roughness. A second spacer component of the two component spacer is formed abutting the first spacer component. The first spacer component is removed. Thereafter, the second semiconductor material is etched using the second spacer component as an etch mask to provide a fin structure, wherein the second semiconductor material having the greater roughness is removed.

In another aspect of the present disclosure, a method of forming a semiconductor device is provided that includes a fin structure composed of a III-V semiconductor material. In one embodiment, the method includes providing a first III-V semiconductor material in a trench, wherein the trench has dimensions to obstruct defects from reaching the upper surface of the first III-V semiconductor material using aspect ratio trapping. A second III-V semiconductor material is epitaxially formed in the trench, wherein sidewall portions of the second III-V semiconductor material have a greater roughness than a remaining centrally positioned portion of the second III-V semiconductor material. A first spacer is formed on the sidewalls of the trench atop the second III-V semiconductor material having the greater roughness. A second spacer is formed abutting the first spacer. The first spacer is removed selectively to the second spacer. The second III-V semiconductor material is then etched using the second spacer as an etch mask to provide a fin structure, wherein the etch process removes the second III-V semiconductor material having the greater roughness. A gate structure is formed on the fin structure. A source and drain region are formed on opposing sides of the gate structure.

In another aspect, a semiconductor device is provided that includes a channel region composed of III-V semiconductor material that is substantially free of defects and roughness. In some embodiments, the semiconductor device comprises a fin structure composed of a type III-V semiconductor material that is substantially free of defects, and has sidewalls that are substantially free of roughness caused by epitaxially growing the type III-V semiconductor material abutting a dielectric. A gate structure is present on a channel portion of the fin structure. A source region and a drain region are present on opposing sides of the gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
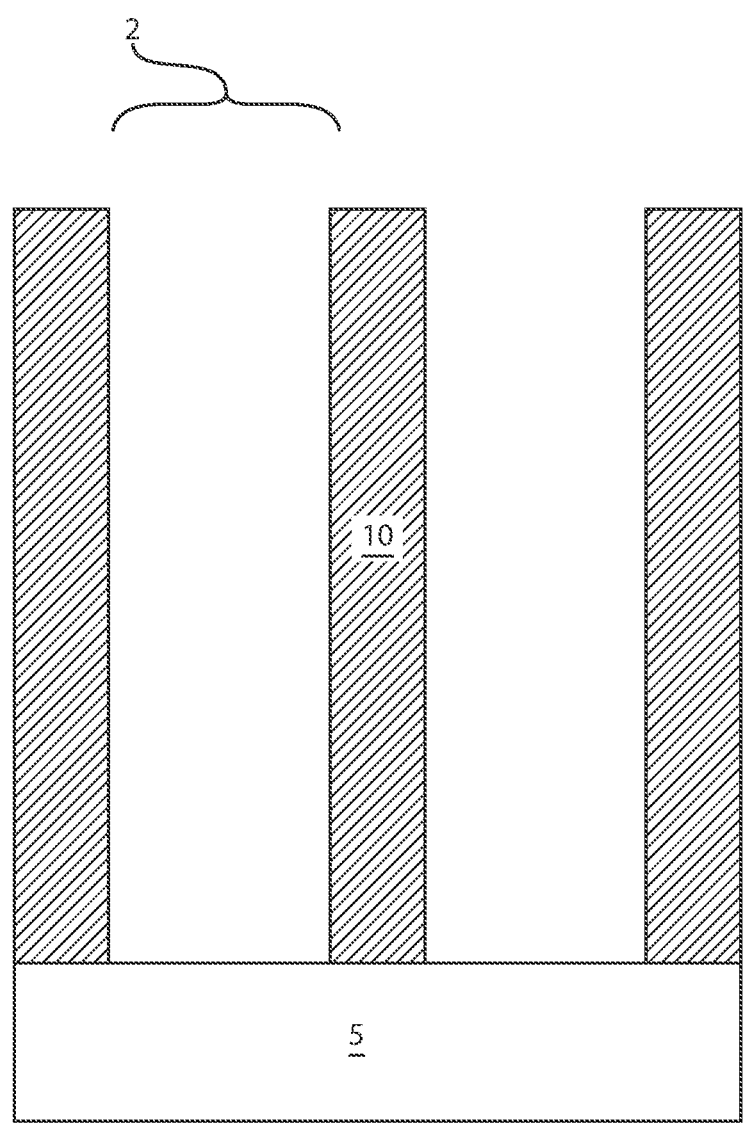
FIG. 1 is a side cross-sectional view depicting forming a plurality of trenches through a dielectric material to a base semiconductor layer, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a fin structure composed of III-V semiconductor materials. The fin structure may be used in the channel region of a semiconductor device, such as a field effect transistor (FET). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

III-V semiconductor materials are being touted as viable channel materials for continued CMOS scaling due to their high electron mobility. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. In some embodiments, the fin structures provided by the methods and structures of the present disclosure are composed of epitaxially semiconductor materials that have low defect density. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

To provide a low defect density, the epitaxially formed III-V semiconductor materials for the fin structures can be formed using aspect ratio trapping (ART). In ART process, III-V semiconductor materials are epitaxially grown in a dielectric trench by using the exposed silicon at the trench bottom as the seed. Epitaxy defects due to the large lattice mismatch between epitaxial III-V semiconductor material and the semiconductor containing deposition surface is trapped in the lower portion of the trench, resulting in virtually defect-free III-V semiconductor in upper portion of trench.

A practical issue with ART processing is that, when the III-V semiconductor is epitaxially grown next to the dielectric sidewalls, surface roughness (or pits) are formed. It has been determined, that the rough III-V semiconductor material sidewalls causes mobility degradation and reliability issue when FinFETs are formed with the fin structures including rough portions of III-V semiconductor material. Therefore, there is a need for improving III-V FinFET with smooth fin sidewalls. It is further desired to form III-V with a tight pitch so that dense FinFETs can be formed on a given area to improve device density. The methods and structures of the present disclosure are now discussed with more detail referring to FIGS. 1-8B.

FIG. 1 depicts forming a plurality of trenches 2 through a dielectric material 20 to a base semiconductor layer, e.g., a semiconductor substrate 5. The semiconductor substrate 5 that is depicted in FIG. 1 may be provided by any semiconductor material. In some embodiments, the semiconductor material of the semiconductor substrate 5 is a type IV semiconductor. By "type IV semiconductor" it is meant that the semiconductor material includes at least one element from Group IVA (i.e., Group 14) of the Periodic Table of Elements. Examples of type IV semiconductor materials that are suitable for the semiconductor substrate 5 include silicon (Si), germanium (Ge), silicon germanium (SiGe), silicon doped with carbon (Si:C), silicon germanium doped with carbon (SiGe:C) and a combination thereof. The semiconductor substrate 5 may be a bulk substrate or a silicon on insulator (SOI) substrate. It is noted that any type of substrate structure may be employed so longs as the upper surface of the semiconductor substrate 5 can provide an epitaxial deposition surface.

The trenches 2 are formed through a dielectric layer 10, wherein the base of the trench 2 is provided by an exposed upper surface of the semiconductor substrate 5. The dielectric layer 10 may be any non-crystalline material. For example, the dielectric layer 10 may be a nitride, such as silicon nitride, or an oxide, such as silicon dioxide. The dielectric layer 10 may be formed by deposition, such as chemical vapor deposition, e.g., plasma enhanced chemical vapor deposition, or can be formed using a growth process, such as thermal oxidation. In some other embodiments, the dielectric layer 10 may be deposited using spin on deposition methods. As will be further discussed below, the dielectric layer 10 may have a thickness corresponding to a desired height (e.g., 25 nm to 2000 nm) of crystalline material to be deposited in an opening formed through the dielectric layer 10, which is hereafter referred to as the trench 2 formed through the dielectric layer 10. In some embodiments, the trench 2 may be formed using photolithography and etch processes. For example, a mask such as a photoresist mask, can be formed over the dielectric layer 10. The mask can be patterned to expose at least a portion of the dielectric layer 10 in which the trench 2 is to be formed. The exposed portion of the dielectric layer 10 may then be removed, e.g., by an etch process, such as reactive ion etch (RIE), to define the trenches 2, which can extend to a surface of the substrate 5 and may be defined by at least one dielectric sidewall, e.g., a non-crystalline sidewall.

In one example, the width of the trench 2 may be 400 nm or less, 350 nm or less or 200 nm or less, 100 nm or less or 50 nm or less, in which theses sizes are effective for ART. Alternatively, the width of the trench 2 may be 5 um or less. In another alternative, the width of the opening may be 1 um or less. The length of the trench 2 may be arbitrary. Alternatively, the length of the trench 2 may be substantially larger than the width of the trench 2, for example greater than 10 times larger, or greater than 100 times larger. In one example, the length of the trench 2 is 2 um.

In some embodiments, the dimensions of the trench 2 are used to trap defects when epitaxially growing the crystalline material, e.g., the first type III-V semiconductor material 15, using ART (aspect ratio trapping) techniques. In such a case, the aspect ratio (AR—height/width) may be greater than 1, although it possible for the aspect ratio to be lower in ART devices, for example, the aspect ratio can be 0.5. (Aspect ratio is defined for trenches as the ratio of the trench height/trench width). In some embodiments, the aspect ratio of the trench is greater than 2:1.

Figure 2:
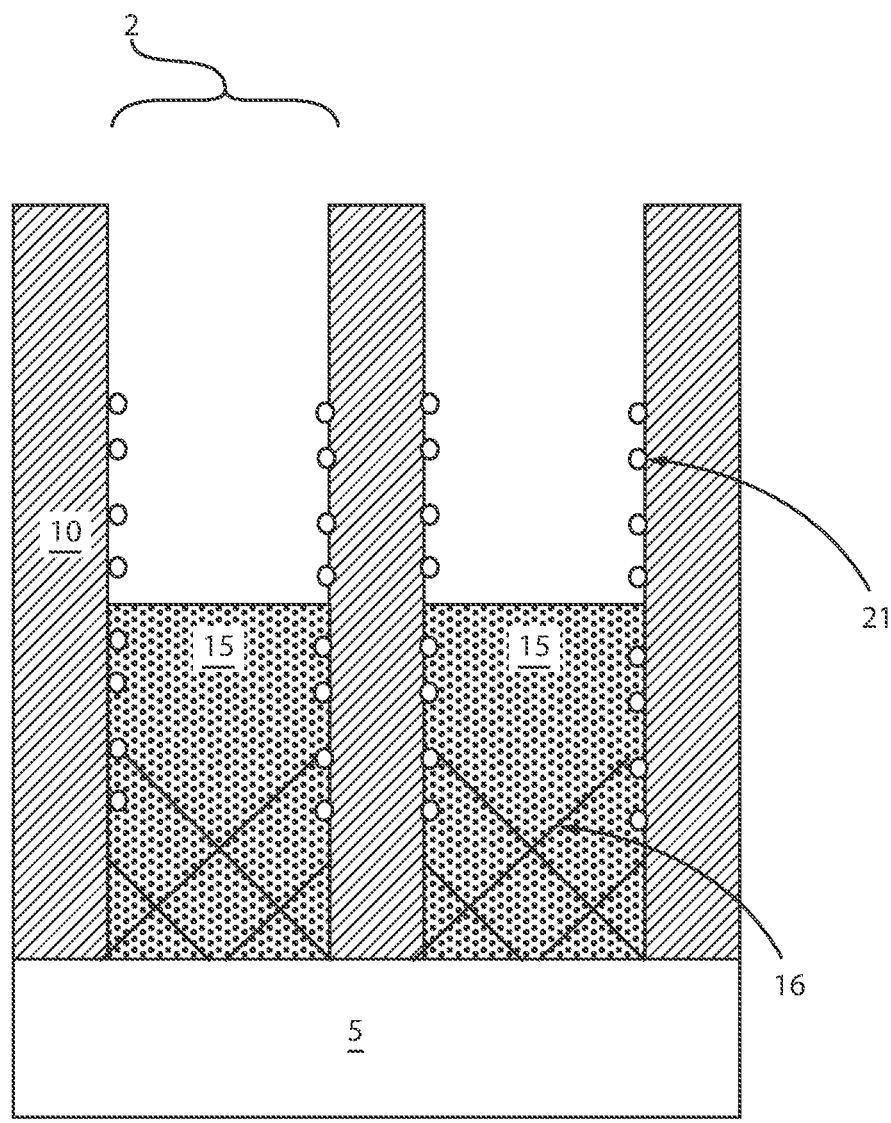
FIG. 2 is a side cross-sectional view depicting forming a first III-V semiconductor material in the trenches, wherein an aspect ratio of the trenches traps defects from reaching an upper surface of the first III-V semiconductor material, in accordance with one embodiment of the present disclosure.

FIG. 2 depicts forming a first type III-V semiconductor material 15 in the trenches 2, wherein the aspect ratio of the trenches 2 traps defects 16 from reaching an upper surface of the first type III-V semiconductor material 15. The first type III-V semiconductor material 15 is formed using an epitaxial deposition process. For example, the first type III-V semiconductor material 15 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The epitaxial growth system may be a single-wafer or multiple-wafer batch reactor. A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking. In some embodiments, the IV substrate at trench bottoms may be etched to form a V-shape (not shown) before epitaxy growth of III-V materials in the trench. The V-shape bottom further help trap epitaxy defects in the lower portion of the trench.

The composition of the first type III-V semiconductor material 15 that is deposited starting on the semiconductor substrate 5 at the base of the trench 2 may be composed of indium phosphide (InP). In some embodiments, the indium phosphide (InP) first type III-V semiconductor material 15 may be deposited on a semiconductor substrate 5 that is composed of silicon, e.g., single crystal silicon (Si). It is noted that indium phosphide (InP) is only one example of a type III-V semiconductor material that can be used for the first type III-V semiconductor material 15. Other III-V semiconductor materials that are suitable for the first type III-V semiconductor material 15 may include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Referring to FIG. 2, dislocation defects 16 in the first type III-V semiconductor material 15 reach and terminate at the sidewalls of the trench 2 provided by the etched dielectric layer 10 at or below a prescribed vertical distance from the surface of the semiconductor substrate 5, such that dislocations in first type III-V semiconductor material 15 decrease in density with increasing distance from the bottom portion of the trench 2. Accordingly, the bottom portion of the se first type III-V semiconductor material 15 comprises lattice defects 16, and the upper portion of the first type III-V semiconductor material 15 is substantially free of crystalline defects. The amount of crystalline defects present at the upper surface of the first type III-V semiconductor material 15 may be substantially 0. In other examples, the amount of crystalline defects in the first type III-V semiconductor material 15 may range from $1E4/cm^2$ to $1E10/cm^2$. Various crystalline defects such as threading dislocations, stacking faults, twin boundaries, or anti-phase boundaries may thus be substantially eliminated from the upper portion of the crystalline material.

It is further noted that epitaxial formation is selective to semiconductor material. Therefore, the epitaxially formed first type III-V semiconductor material 15 is formed from the bottom of the trench 2, i.e., from the deposition surface provided by the semiconductor substrate 5, toward the top of the trench 2. The first type III-V semiconductor material 15 is not formed on the sidewalls of the trench 2 provided by the etched dielectric layer 10, i.e., the sidewalls of the trench are not an epitaxial growth surface, but the first type III-V semiconductor material 15 is grown abutting the sidewalls of the trench 2 provided by the etched dielectric layer 10. This abutting relationship provides that pits 21 are formed between the epitaxially formed first type III-V semiconductor material 15 and the sidewalls of the trench 2 provided by the etched dielectric layer 10. These pits 21 can be characterized as a surface roughness between the first type III-V semiconductor material 15 and the sidewalls of the trench 2 provided by the etched dielectric layer 10.

In some embodiments, indium phosphide (InP) is selected as the composition for the first type III-V semiconductor material 15 to serve as a semi-insulator between the later formed second type III-V semiconductor material 20, and the semiconductor substrate 5, e.g., silicon semiconductor substrate 5. As noted above, any dislocation defects that may form by the difference in lattice dimension of the indium phosphide (InP) first type III-V semiconductor material 15 and the silicon semiconductor substrate 5 can be retained in a lower portion of the first type III-V semiconductor material 15 in accordance with the ART principles described above.

In some embodiments, the height of the epitaxially formed first type III-V semiconductor material 15 may be limited to be less than half the height of the trench 2. In other embodiments, the height of the epitaxially formed first type III-V semiconductor material 15 may be limited to be less than ⅓ the height of the trench 2. In yet other embodiments, the height of the epitaxially formed first type III-V semiconductor material 15 may be limited to be less than ¼ the height of the trench 2. The height of the epitaxially formed first type III-V semiconductor material 15 may be adjusted by depositing the first type III-V semiconductor material 15 to overfill the trenches 2; planarizing, e.g., chemical mechanical planarizing, the overfill material; and recessing the first type III-V semiconductor material 15 within the trench 2 to the desired height using an etch process, such as reactive ion etch, which may be selective to the dielectric layer 10.

Figure 3:
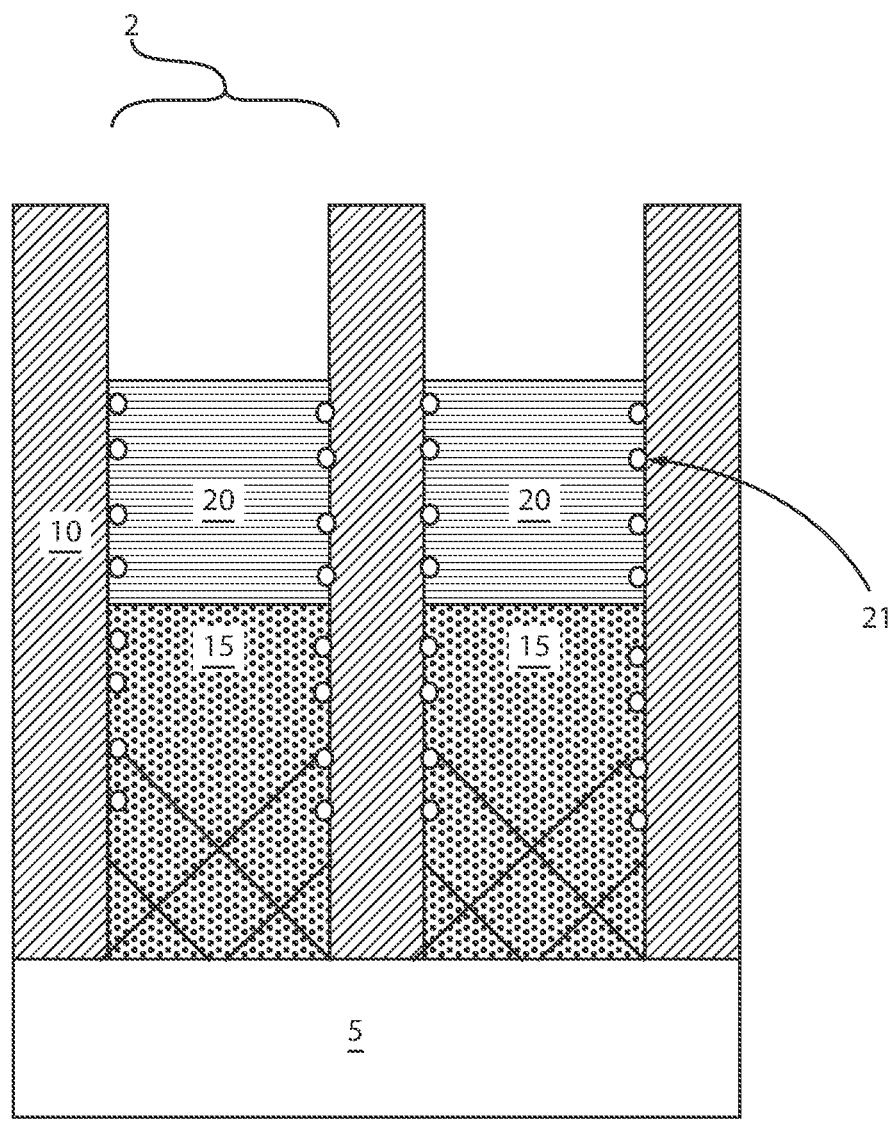
FIG. 3 is a side cross-sectional view depicting forming a second III-V semiconductor material on the upper surface of first III-V semiconductor material, wherein the portion of the second III-V semiconductor material touching the sidewalls of the dielectric have a greater roughness than the central portions of the second III-V semiconductor material, in accordance with one embodiment of the present disclosure.

FIG. 3 depicts forming a second III-V semiconductor material 20 on the upper surface of first III-V semiconductor material 15, wherein the portion of the second type III-V semiconductor material 20 touching the sidewalls of the dielectric layer 10 that have been etched to provide the trench 2 sidewalls has a greater roughness than the central portions of the second type III-V semiconductor material 20. Similar to the first type III-V semiconductor material 15, the second type III-V semiconductor material 20 may be formed using an epitaxial deposition process. Therefore, the epitaxial deposition processing described above with reference to FIG. 2 for forming the first type III-V semiconductor material 15, is suitable for describing the epitaxial deposition processes for epitaxially forming at least some of the embodiments of the second type III-V semiconductor material 20 that is depicted in FIG. 3.

In some embodiments, the second type III-V semiconductor material 20 is composed of indium gallium arsenide (InGaAs). The indium gallium arsenide (InGaAs) for the second type III-V semiconductor material 20 may be epitaxially formed on the substantially defect free upper surface of the indium phosphide (InP) first type III-V semiconductor material 15, in which the first type III-V semiconductor material was epitaxially formed on a silicon semiconductor substrate 5. Indium gallium arsenide (InGaAs) and indium phosphide (InP) have the similar lattice constants, and therefore the indium gallium arsenide (InGaAs) second type III-V semiconductor material 20 is virtually defect-free. However, in some embodiments, roughness/pitting (pits 21) in a portion of the material spanning on the order of a couple of nm, e.g., 1 nm to 5 nm (as measured from the sidewall of the trench 2), is formed at indium gallium arsenide (InGaAs) second type III-V semiconductor material 20 and dielectric layer 10, e.g., oxide dielectric layer, interfaces due to the nature of epitaxy. As discussed above, similar roughness is also formed between indium phosphide (InP) first type III-V semiconductor 15 and the dielectric layer 10 interface, but because the InP serves as semi-insulator and devices are built in the InGaAs layer it is less critical that roughness be present in the first type III-V semiconductor material.

It is noted that indium gallium arsenide (InGaAs) is only one possible composition for the second type III-V semiconductor material 20. Other type III-V semiconductor material compositions are equally applicable to the second type III-V semiconductor material 20. Examples of suitable type III-V semiconductor compositions for the second type III-V semiconductor material 20 may include aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP) and combinations thereof.

The second type III-V semiconductor material 20 is epitaxially formed within the trenches 2 to a height that is suitable to provide the height of fin structures for FinFET semiconductor devices. In some embodiments, the second type III-V semiconductor material 20 is deposited to a height that would be suitable for forming fin structures having a height ranging from 10 nm to 100 nm. In another example, the second type III-V semiconductor material 20 is deposited to a height that could provide fin structures having a height ranging from 20 nm to 50 nm. The upper surface of the second type III-V semiconductor material 20 may also be recessed to expose a portion of the trench sidewall. The portion of the trench sidewall exposed provides the formation site of the subsequently described first spacer 25. In some embodiments, the second type III-V semiconductor material 20 is recessed within the trench 2 to expose a surface of the trench sidewall having a length ranging from 2 nm to 20 nm. In other examples, the second type III-V semiconductor material 20 is recessed within the trench 2 to expose a surface of the trench sidewall having a length ranging from 2 nm to 5 nm.

The height of the epitaxially formed second type III-V semiconductor material 20 may be adjusted by depositing the second type III-V semiconductor material 20 to overfill the trenches 2; planarizing, e.g., chemical mechanical planarizing, the overfill material; and recessing the second type III-V semiconductor material 20 within the trench 2 to the desired height using an etch process, such as reactive ion etch, which may be selective to the dielectric layer 10.

Figure 4:
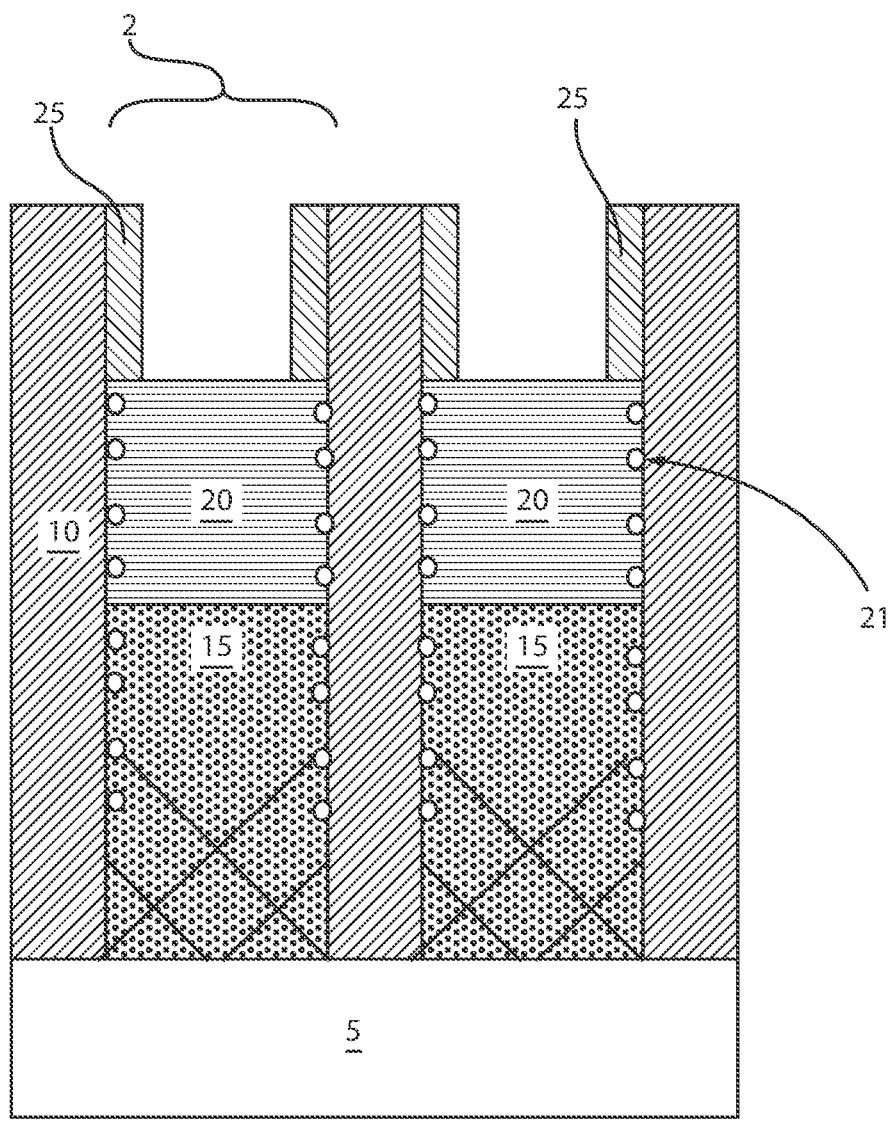
FIG. 4 is a side cross-sectional view depicting forming a first spacer on the sidewalls of the dielectric layer that provide the trench sidewalls, in which the first spacer is atop the portion of the second III-V semiconductor material having the greater roughness, in accordance with one embodiment of the present disclosure.

FIG. 4 depicts one embodiment of forming a first spacer 25 on the sidewalls of the dielectric layer 10 that provide the trench sidewalls, in which the first spacer 25 is atop the portion of the second type III-V semiconductor material 20 having the greater roughness, i.e., includes pits 21. More specifically, in some embodiments, the first spacer 25 is formed on the sidewall of the trench 2, and has a width that is sufficient to cover the portion of the second type III-V semiconductor material 20 having the roughness that results from the pit 21 formation due to the interaction between the epitaxial growth of the second type III-V semiconductor material 20 and the non-epitaxial contact with the etched portions of the dielectric layer 10 that provide the sidewalls of the trench 2. In some embodiments, to cover the rough/pitted portion of the second type III-V semiconductor material, the first spacer 25 may have a width ranging from 1 to 5 nm. In other embodiments, to cover the rough/pitted portion of the second type III-V semiconductor material, the first spacer 25 may have a width ranging from 1 to 3 nm.

The first spacer 25 is typically composed of a dielectric material. For example, the first spacer 25 may be composed of an oxide, nitride or oxynitride. In one example, the first spacer 25 is composed of an oxide, such as silicon oxide. It is noted that this is only one example of a composition that is suitable for the first spacer 25. Any composition may be suitable so long as the first spacer 25 may be removed selectively to at least the subsequently described second spacer 30, in which the second spacer 30 may be a nitride, such as silicon nitride.

The first spacer 25 may be formed using deposition and etch processes. For example, the first spacer 25 can be formed beginning with a conformal deposition process to form a blanket dielectric material layer on the vertically orientated surfaces of the exposed trench sidewalls and the horizontally orientated surfaces provided by the upper surfaces of the dielectric layer 10. The term "conformal layer" denotes a layer having a thickness that does not deviate from greater than or less than 30% of an average value for the thickness of the layer. To provide the conformal layer, the dielectric material layer for forming the first spacer 25 may be deposited using atomic layer deposition (ALD) or plasma enhanced chemical vapor deposition (PECVD). In a following process step, the portions of the conformal layer for providing the first spacer on the horizontally orientated surfaces provided by the upper surfaces of the dielectric layer 10 are removed using an anisotropic etch process. As used herein, an "anisotropic etch process" denotes a material removal process in which the etch rate in the direction normal to the surface to be etched is greater than in the direction parallel to the surface to be etched. The anisotropic etch process used at this stage of the process flow may be reactive ion etch (RIE), plasma etching or laser etching. Following the anisotropic etch process, e.g., RIE, to remove the portions of the conformal layer on the horizontally orientated surfaces, the remaining portions of the conformal layer are present on the vertically oriented surfaces, i.e., trench sidewalls, and provide the first spacer 25.

Figure 5:
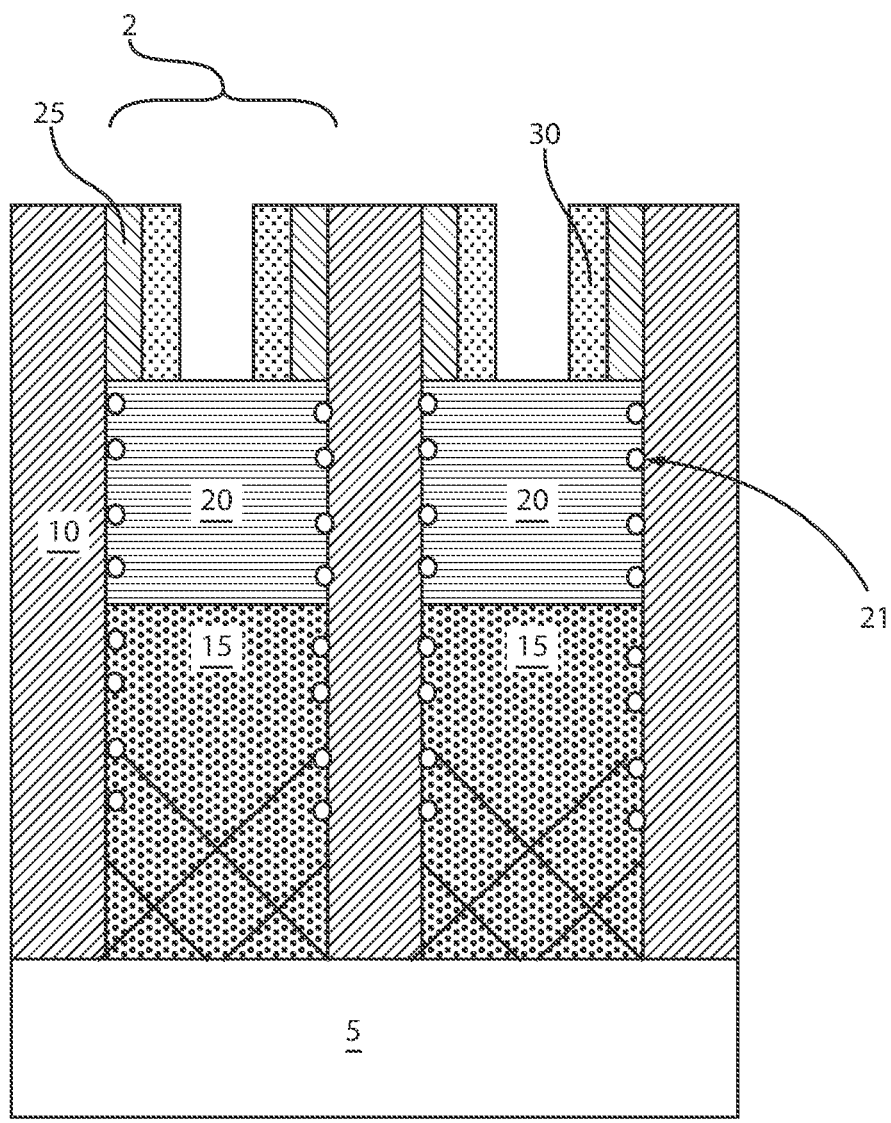
FIG. 5 is a side cross-sectional view depicting forming a second spacer abutting the first spacer.

FIG. 5 depicts one embodiment of forming a second spacer 30 abutting the first spacer 25. The combination of the first spacer 25 and the second spacer 30 may be collectively referred to as a two component spacer 25, 30, in which the first spacer 25 provides the first component, and the second spacer 30 provides the second component. In some embodiments, the second spacer 30 may be formed in direct physical contact with the first spacer 25, wherein the sidewall of the second spacer 30 interfaces with the sidewall of the first spacer 25. The second spacer 30 has a width that dictates the width of the fin structures that are subsequently etched from the second type III-V semiconductor material 20, in which the second spacer 30 will be functioning as an etch mask. For example, the width of the second spacer 30 may be selected so that the subsequently formed fin structures will have a width of less than 20 nm. In another embodiment, the width of the second spacer 30 may be selected so that the subsequently formed fin structures will have a width ranging from 3 nm to 8 nm.

The second spacer 30 is typically composed of a dielectric material, but any material may be selected for the second spacer 30 so long as the first spacer 25, and the second type III-V semiconductor material 20, can be etched selectively to the second spacer 30. In some embodiments, the second spacer 30 is composed of a nitride, such as silicon nitride. In one example, the second spacer 30 is composed of silicon nitride when the first spacer 25 is composed of silicon oxide, and the second type III-V semiconductor material 20 is composed of indium gallium arsenide (InGaAs). It is noted that silicon nitride is only one example of the composition of the second spacer 30 and that other compositions are equally applicable for providing the second spacer 30. The second spacer 30 may be formed using deposition and etch back processes similar to the deposition and etch back processes that have been described above for forming the first spacer 25. Therefore, the above description of forming the first spacer 25, as described above with reference to FIG. 4, may provide the description of providing at least one embodiment of the second spacer 30 that is depicted in FIG. 5. For example, the second spacer 30 may be formed using a conformal deposition process, such as plasma enhanced chemical vapor deposition (PECVD), in combination with an anisotropic etch, such as reactive ion etch.

Figure 6A:
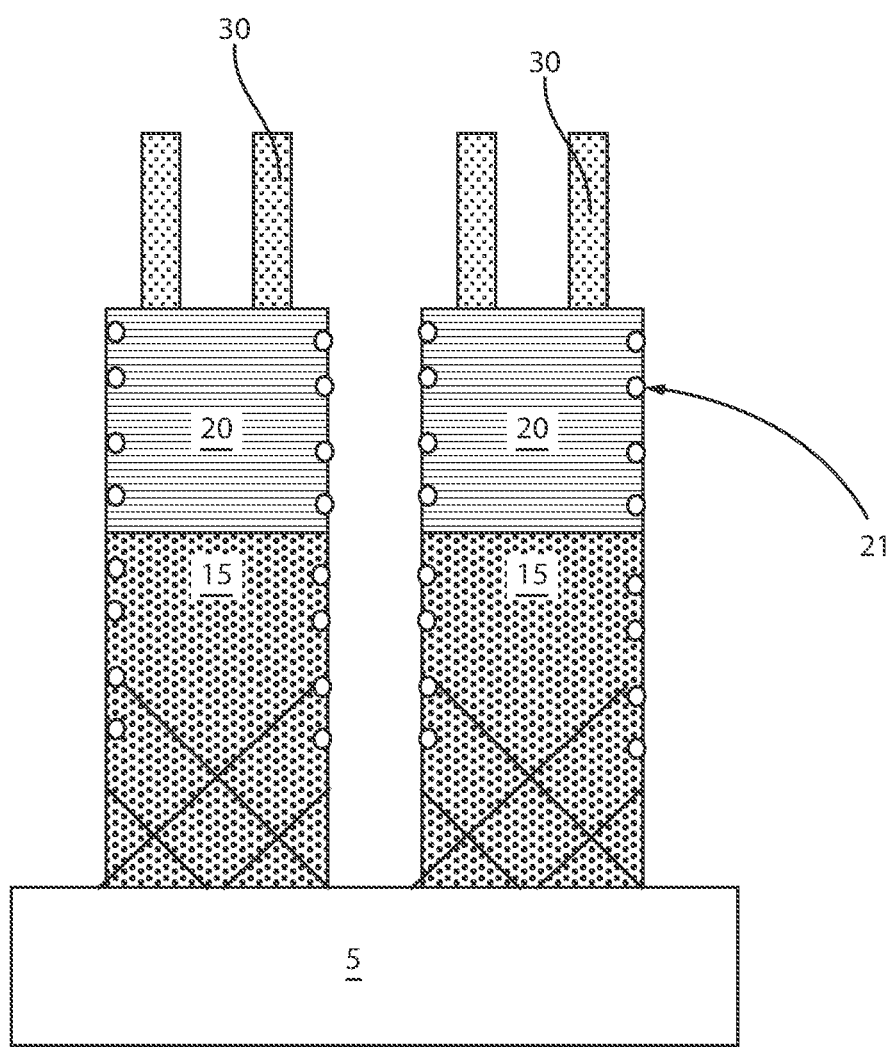
FIG. 6A is a side cross-sectional view depicting removing the dielectric layer and the first spacer from the structure depicted in FIG. 5 selectively to the second spacer and the second III-V semiconductor material, in accordance with one embodiment of the present disclosure, in accordance with one embodiment of the present disclosure.
Figure 6B:
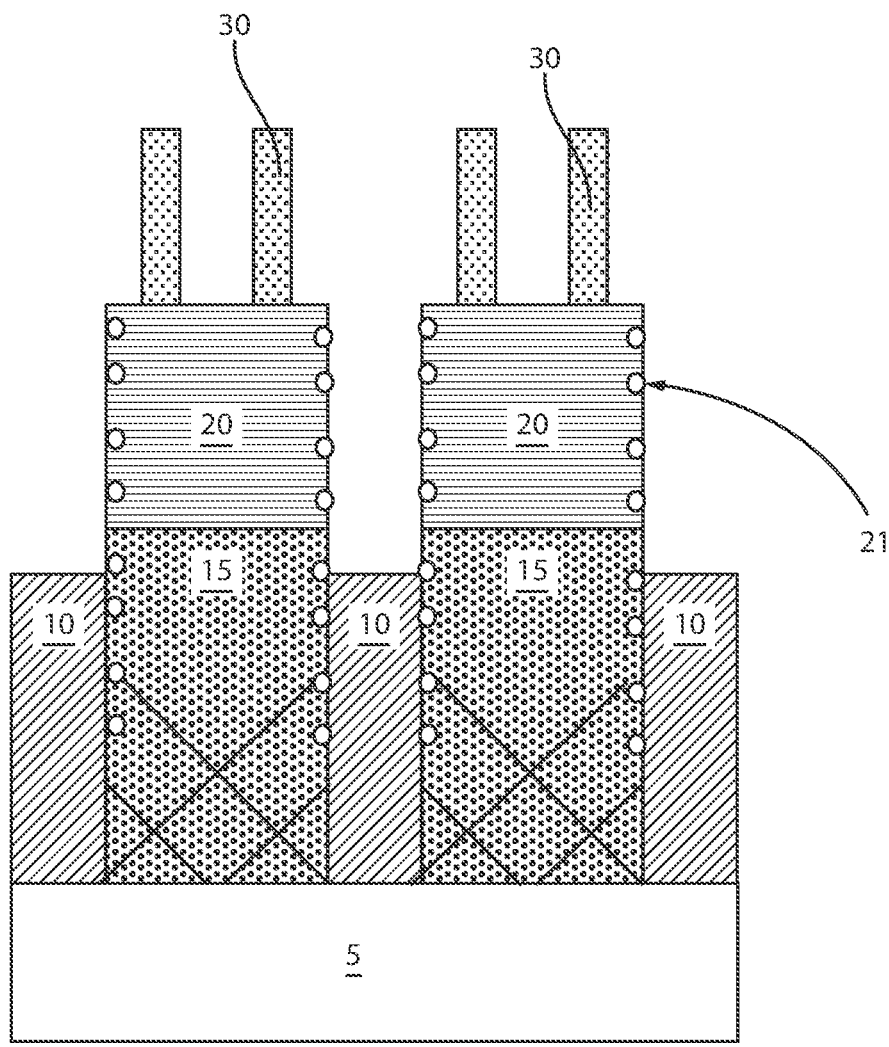
FIG. 6B is a side cross-sectional view of recessing the dielectric layer and removing the first spacer from the structure depicted in FIG. 5 selectively to the second spacer and the second III-V semiconductor material, in accordance with one embodiment of the present disclosure, in accordance with another embodiment of the present disclosure.

FIG. 6A depicts removing the dielectric layer 10 and the first spacer 25 from the structure depicted in FIG. 5 selectively to the second spacer 30 and the second III-V semiconductor material 20. The dielectric layer 10 and the first spacer 25 may be removed using a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. In some embodiments, the etch process for removing the dielectric layer 10 and the first spacer 25 may be an anisotropic etch, such as reactive ion etch, plasma gas etch or laser etch. In other embodiments, the etch process for removing the dielectric layer 10 and the first spacer 25 may be an isotropic etch, such as a wet chemical etch or plasma etch. In some embodiments, the etch process for removing the dielectric layer 10 and the first spacer 25 is a combination of anisotropic etching and isotropic etching. In some embodiments, the dielectric layer 10 may be removed in its entirety, as depicted in FIG. 6A. Removing the dielectric layer 10 in its entirety exposes the rough, i.e., pitted 21, portions of the second type III-V semiconductor material 20. In other embodiments, the dielectric layer 10 does not have to be removed in its entirety, as depicted in FIG. 6B. For example, referring to FIG. 6B, the dielectric layer 10 may be recessed to a height that exposes the rough, i.e., pitted, portions of the second type III-V semiconductor material 20, but a portion of the dielectric layer 10 can remain abutting the first type III-V semiconductor material 15.

Figure 7A:
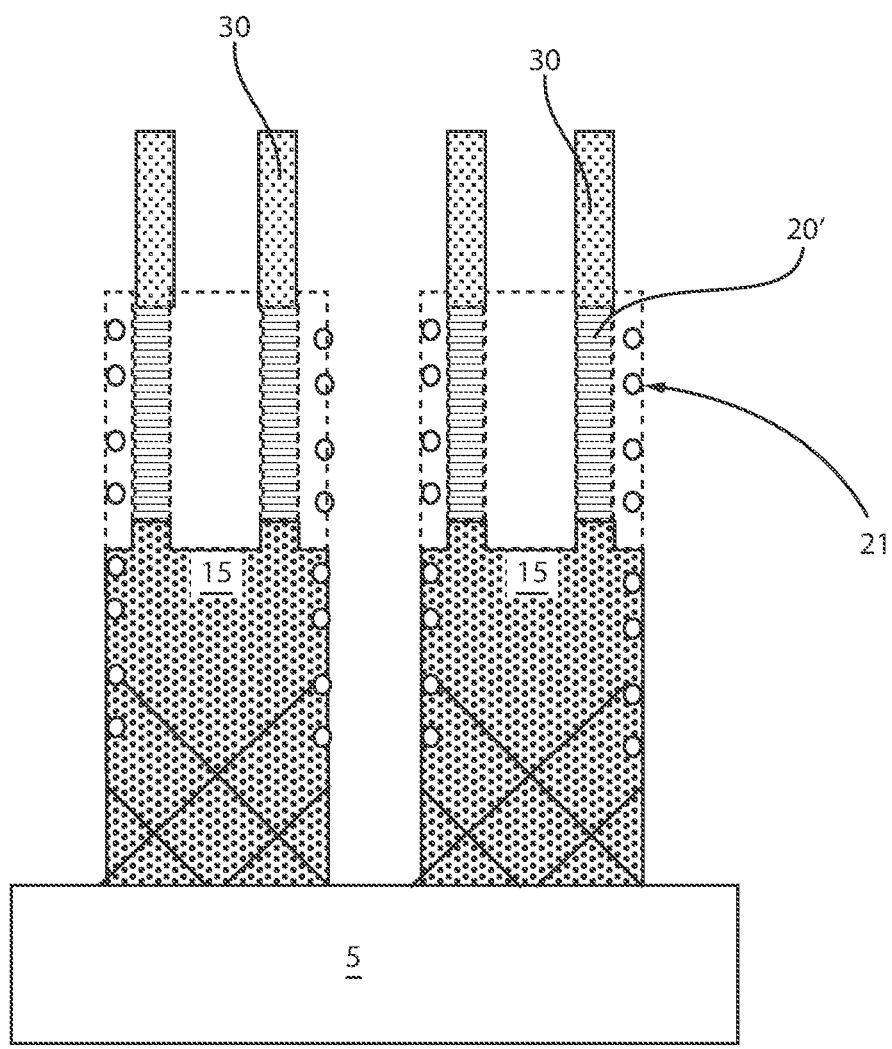
FIG. 7A is a side cross-sectional view depicting etching the second III-V semiconductor material in the structure depicted in FIG. 6A using the second spacer as an etch mask to provide a fin structure, wherein the etch process removes the second III-V semiconductor material having the greater roughness, in accordance with one embodiment of the present disclosure.

FIG. 7A depicting etching the second type III-V semiconductor material 20 in the structure depicted in FIG. 6A using the second spacer 30 as an etch mask to provide fin structure 20', wherein the etch process removes the portion of the second type III-V semiconductor material having the greater roughness (presence of pits 21). The portions of the second III-V semiconductor material 20 that are removed at this stage of the process flow are illustrated by the dashed lines having reference number 21' in FIG. 7A.

The rough portions of the second type III-V semiconductor material 20 may be removed by an anisotropic etch, such as reactive ion etching or laser etching. The etch process for removing the rough portions of the second type III-V semiconductor material 20 may be selective to the second spacer 30. In some embodiments, the etch process may be timed to vertically etch through the entire portion of the second type III-V semiconductor material 20 that includes pits 21/roughness until reaching the first type III-V semiconductor material. End point detection may be employed to terminate the etch process.

Each of the fin structures 20' formed from the second type III-V semiconductor material may have a height ranging from 5 nm to 200 nm. In another embodiment, each of the fin structures 20' has a height ranging from 10 nm to 100 nm. In one example, each of the fin structures 20' has a height ranging from 20 nm to 50 nm. Each of the plurality of fin structures 20' may have a width of less than 20 nm. In another embodiment, each of the fin structures 20' has a width ranging from 3 nm to 8 nm. Although two fin structures 20' are depicted in FIG. 7A on each island of first type III-V semiconductor material 15, the present disclosure is not limited to only this example. It is noted that any number of fin structures 20' may be formed from the second type III-V semiconductor material. The pitch separating adjacent fin structures may range from 35 nm to 45 nm. In another example, the pitch separating adjacent fin structures 20' may range from 30 nm to 40 nm.

The pitted portions/rough portions of the second type III-V semiconductor material 20 have been removed providing fin structures 20' of epitaxially formed type III-V semiconductor material that are substantially free of defects, and have sidewalls that are substantially free of roughness and/or pitting caused by epitaxially growing the type III-V semiconductor material abutting a dielectric.

Figure 7B:
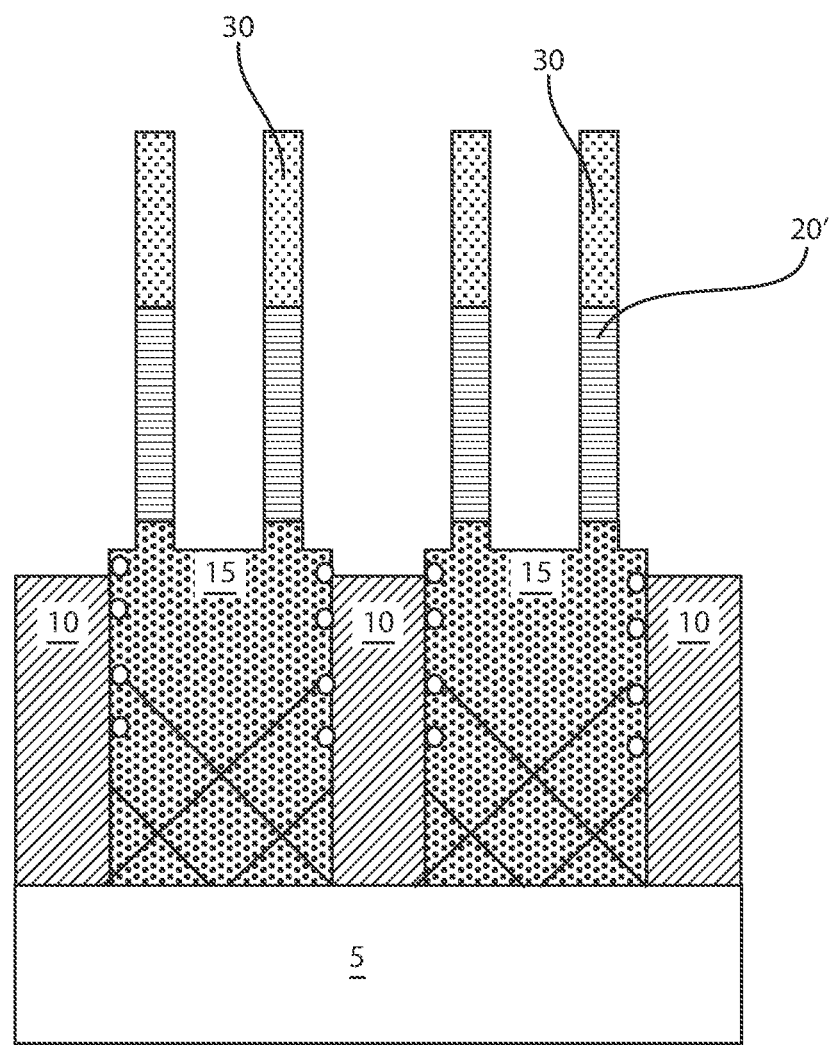
FIG. 7B is a side cross-sectional view depicting etching the second III-V semiconductor material in the structure depicted in FIG. 6B using the second spacer as an etch mask to provide a fin structure, wherein the etch process removes the second III-V semiconductor material having the greater roughness, in accordance with one embodiment of the present disclosure.

FIG. 7B depicts etching the second III-V semiconductor material 20 in the structure depicted in FIG. 6B using the second spacer 30 as an etch mask to provide a fin structures 20'. The etch process described in FIG. 7A is equally applicable to the etch process described in FIG. 7B.

Figure 8B:
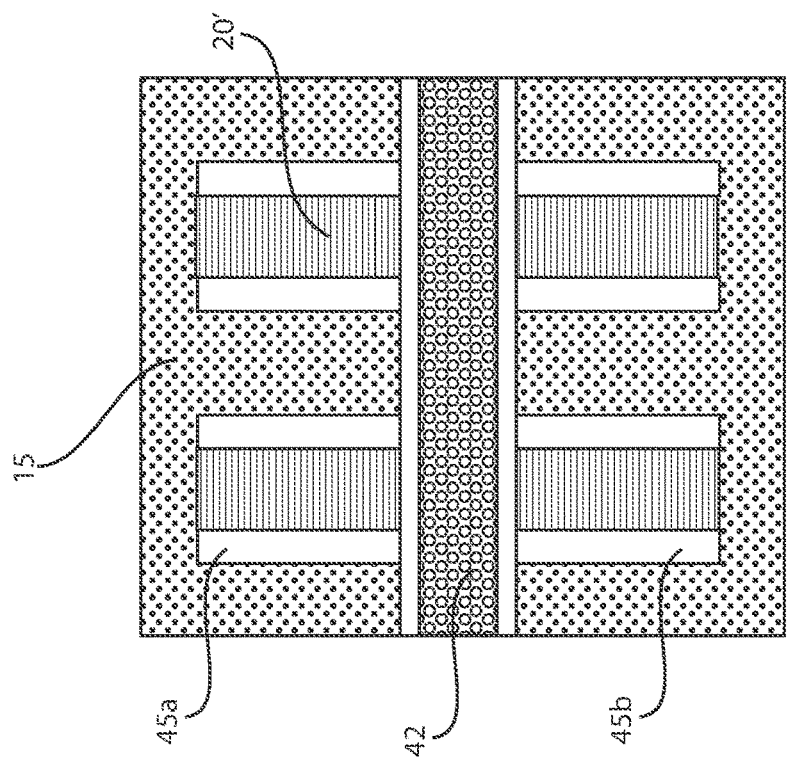
FIG. 8B is a top down view of the structure depicted in FIG. 7A.
Figure 8A:
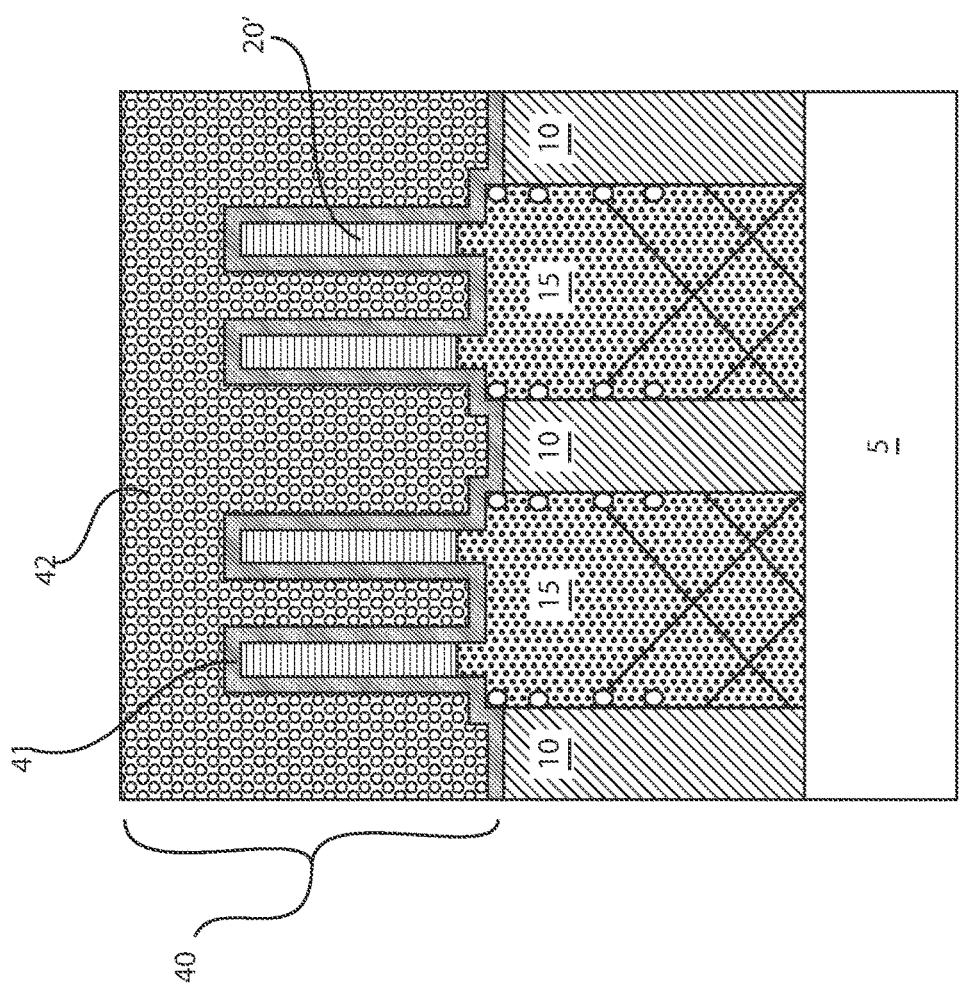
FIG. 8A is a side cross-sectional view depicting forming a gate structure and source and drain regions on the structure depicted in FIG. 7B.

The second spacer 30 may be removed using selective etching or planarization. FIGS. 8A and 8B depicting forming a gate structure 40 on the channel region of the fin structures 20', and forming a source region 45a and a drain region 45b on the respective source and drain region portions of the fin structures 20' of the structure depicted in FIG. 7B. FIG. 8A is a side cross-sectional view, and FIG. 8B is a top down view of two fin structures 20' overlying an island of first type III-V semiconductor material 15.

The "gate structure" functions to switch the semiconductor device from an "on" to "off" state, and vice versa. The gates structure 40 is formed on the channel region of the fin structures 20'. The gate structure 40 typically includes at least a gate dielectric 41 that is present on the channel region of the fin structure 20', and a gate electrode 42 that is present on the gate dielectric 41.

In one embodiment, the at least one gate dielectric layer 41 includes, but is not limited to, an oxide, nitride, oxynitride and/or silicates including metal silicates, aluminates, titanates and nitrides. In one example, when the at least one gate dielectric layer 41 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 41 may vary, but typically, the at least one gate dielectric layer 41 has a thickness from 1 nm to 10 nm. In another embodiment, the at least one gate dielectric layer 41 has a thickness from 1 nm to 3 nm.

The conductive material of the gate electrode 42 may comprise polysilicon, SiGe, a silicide, a metal or a metal-silicon-nitride such as Ta—Si—N. Examples of metals that can be used as the gate electrode 42 include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing.

The gate structure 40 may be formed by using a deposition method, such as a chemical vapor deposition method and/or a physical vapor deposition (PVD), to deposit the material layers for the at least one gate dielectric layer and the at least one gate electrode followed by photolithography and etch processing.

In some embodiments, a gate sidewall spacer 43 can be formed on the sidewall of the gate structure 40. In one embodiment, the gate sidewall spacer 43 may be formed by using a blanket layer deposition process, such as CVD, and an anisotropic etchback method. The gate sidewall spacer 43 may have a width ranging from 2.0 nm to 15.0 nm, and may be composed of a dielectric, such as a nitride, oxide, oxynitride, or a combination thereof.

A source region 45a and a drain region 45b may then be formed on opposing sides of the gate structure 40. In one example, each of the source region 45a and drain region 45b may be composed of an epitaxial semiconductor material doped with an n-type or p-type dopant, in which the doping of the source and drain regions 45a, 45b typically dictates the conductivity type of the FinFET, e.g., whether the FinFET is a p-type FinFET or an n-type FinFET. For example, in the embodiments in which the source and drain regions 45a, 45b are composed of n-type conductivity epitaxial semiconductor material, the FinFET is an n-type device; and in the embodiments in which the source and drain regions 45a, 45b are composed of p-type conductivity epitaxial semiconductor material, the FinFET is a p-type device.

In one example, the epitaxial semiconductor material for the source and drain regions 45a, 45b may be a type IV or type III-V semiconductor material that is formed on the source and drain region portions of the fin structures 20', which are on opposing sides of the channel portion of the fin structure 5a, 5b that the gate structure 40 is present on. It is noted that the epitaxial semiconductor material may be formed on the sidewalls and the upper surfaces of the fin structures 20', but for the purposes of illustrating the presence of the fin structures 20' has only been depicted on the sidewall of the fin structures 20' in FIG. 8B. The epitaxial semiconductor material for the source and drain regions 45a, 45b may be in situ doped to a p-type or n-type conductivity. The term "in situ" denotes that a dopant, e.g., n-type or p-type dopant, is introduced to the base semiconductor material during the formation of the base material. In one embodiment, in which the source and drain regions 45a, 45b are composed of type III-V semiconductor material and are in-situ doped during the epitaxial deposition process to provide the source and drain regions 45a, 45b having the p-type or n-type conductivity, the dopant gas may be selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof.

It is noted that the above process sequence describes a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

The method described above provides a semiconductor device, e.g., FinFET, including a fin structure 20' comprised of a type III-V semiconductor material that is substantially free of defects, and has sidewalls that are substantially free of roughness that is typically caused by epitaxially growing the type III-V semiconductor material abutting a dielectric material. For example, the maximum dislocation density present in the fin structures should be less than $1E^4/cm^2$. The roughness typically present on the sidewalls of type III-V semiconductor materials results from epitaxial grown processes using aspect ratio trapping in trenches having sidewalls provided by dielectric materials. As described above, the epitaxially grown material abutting the dielectric trench sidewall creates pits at the interface of the epitaxially grown material and the dielectric that results in roughness. The semiconductor devices provided by the present disclosure are free of this type of roughness. The FinFETs disclosed herein also include a gate structure 40 present on a channel portion of the fin structure 20', and a source region 45a and a drain region 45b present on opposing sides of the gate structure 40. The semiconductor device includes a fin structure 20' composed of a second type III-V semiconductor material 20 present epitaxially formed atop a first type III-V semiconductor material 15, wherein a composition of the second type III-V semiconductor material 20 is different than a composition of the first type III-V semiconductor material 15. In some examples, the first type III-V semiconductor material 15 substantially isolates the second type III-V semiconductor material 20 (which provides the fins 20') from an underlying semiconductor substrate 5. In one example, the first III-V semiconductor material 15 is indium phosphide (InP), and the second III-V semiconductor material 20 is indium gallium arsenide (InGaAs). In one example, at least two fins 20' of the second III-V semiconductor material, e.g., indium gallium arsenide (InGaAs), are present on a single island of the first type III-V semiconductor material, e.g., indium phosphide (InP).

The methods and structures that have been described above with reference to FIGS. 1-8B may be employed in any electrical device. For example, the FinFETs that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of reducing roughness in a fin structure comprising:
    forming a dielectric material layer on a planar top surface of a substrate;
    forming a trench in the dielectric material layer to expose a portion of the planar top surface of the substrate;
    forming a semiconductor material having a fin geometry in the trench with a first width of less than 50 nm, wherein a second portion of the semiconductor material contacting dielectric sidewalls of the trench has a greater roughness than a first portion of the semiconductor material that is not in contact with the dielectric sidewalls;
    forming a spacer component abutting the dielectric sidewalls of the trench that are atop the second portion of the semiconductor material having the greater roughness;
    forming a masking structure over the first portion of the semiconductor material; and
    removing the spacer component and the second portion of the semiconductor material using the masking structure as an etch mask to provide the fin structure having a second width of less than 20 nm.

2. The method of claim 1, wherein an aspect ratio of the trench traps defects.

3. The method of claim 2, wherein forming the semiconductor material in the trench includes depositing a first semiconductor material at a base of the trench, wherein the first semiconductor material includes the defects trapped resulting from the aspect ratio of the trench.

4. The method of claim 3, wherein the first semiconductor material is a type III-V semiconductor material.

5. The method of claim 1, further comprising forming said trenches through a dielectric material layer to a base semiconductor layer.

6. The method of claim 5, wherein the first semiconductor material is epitaxially formed on the base semiconductor layer.

7. The method of claim 6, wherein the base semiconductor layer is composed of a type IV semiconductor having a different lattice dimension than the first semiconductor layer, wherein said different lattice dimension causes said defects.

8. The method of claim 7, wherein forming the semiconductor material in the trench further includes depositing a second semiconductor material on the first semiconductor material.

9. The method of claim 8, wherein said forming the second semiconductor material on the upper surface of the first semiconductor material comprises epitaxial deposition, wherein the second portion of the second semiconductor material contacting the dielectric sidewalls of the trench is contacting said dielectric layer, wherein the greater roughness is provided by pits formed by the second semiconductor material being epitaxially formed abutting the non-epitaxial dielectric growth surface of the dielectric layer.

10. The method of claim 9, further comprising removing at least a portion of the spacer.

11. The method of claim 1, wherein etching the semiconductor material using the spacer component as an etch mask comprises an anisotropic etch.

12. A method of reducing roughness in a fin structure comprising:
forming a dielectric material layer on a planar top surface of a substrate;
forming a trench in the dielectric material layer to expose a portion of the planar top surface of the substrate;
forming a semiconductor material in the trench having a fin geometry trench with a first width of less than 50 nm, wherein a second portion of the semiconductor material contacting dielectric sidewalls of the trench has a greater roughness than a first portion of the semiconductor material that is not in contact with the dielectric sidewalls;
forming a spacer abutting the dielectric sidewalls of the trench that are atop the second portion of the semiconductor material having the greater roughness;
forming a masking structure over the first portion of the semiconductor material; and removing the spacer component and the second portion of the semiconductor material using the masking structure as an etch mask to provide the fin structure having a second width of less than 20 nm; and
forming a gate structure on a channel portion of the fin structure.

13. The method of claim 12, further comprising forming source and drain region on opposing sides of the gate structure.

14. The method of claim 12, wherein forming the semiconductor material in the trench includes depositing a first semiconductor material at a base of the trench, wherein the first semiconductor material includes the defects trapped resulting from the aspect ratio of the trench.

15. The method of claim 14, wherein the first semiconductor material is epitaxially formed on a base semiconductor layer.

16. The method of claim 15, wherein the base semiconductor layer is silicon, the first III-V semiconductor material is indium phosphide (InP), and the second III-V semiconductor material is indium gallium arsenide (InGaAs).

17. The method of claim 16, wherein forming the semiconductor material in the trench further includes depositing a second semiconductor material on the first semiconductor material.

18. The method of claim 17, wherein said epitaxially forming the second semiconductor material in the trench comprises forming said second semiconductor material on the upper surface of the first semiconductor material, wherein the portion of the second semiconductor material contacting the sidewalls the trench is contacting said dielectric layer, wherein said greater roughness is provided by pits formed by the second semiconductor material being epitaxially formed abutting the non-epitaxial dielectric growth surface of the dielectric layer.

19. The method of claim 12, wherein etching the semiconductor material using the spacer as an etch mask comprises an anisotropic etch.

20. The method of claim 19, wherein the anisotropic etch comprises reactive ion etching (RIE).

* * * * *